US009646259B2

(12) United States Patent
Shea et al.

(10) Patent No.: US 9,646,259 B2
(45) Date of Patent: May 9, 2017

(54) QUANTUM BITS AND METHODS OF FORMING THE SAME

(71) Applicants: Patrick B. Shea, Alexandria, VA (US); Erica C. Folk, Linthicum Heights, MD (US); Daniel J. Ewing, Overland Park, KS (US); John J. Talvacchio, Ellicott City, MD (US)

(72) Inventors: Patrick B. Shea, Alexandria, VA (US); Erica C. Folk, Linthicum Heights, MD (US); Daniel J. Ewing, Overland Park, KS (US); John J. Talvacchio, Ellicott City, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 165 days.

(21) Appl. No.: 14/460,988

(22) Filed: Aug. 15, 2014

(65) Prior Publication Data
US 2014/0357493 A1    Dec. 4, 2014

Related U.S. Application Data

(62) Division of application No. 13/294,473, filed on Nov. 11, 2011.

(51) Int. Cl.
| | | |
|---|---|---|
| H01L 39/24 | (2006.01) | |
| H01L 39/22 | (2006.01) | |
| G06N 99/00 | (2010.01) | |

(52) U.S. Cl.
CPC ......... *G06N 99/002* (2013.01); *H01L 39/223* (2013.01); *H01L 39/2493* (2013.01)

(58) Field of Classification Search
CPC ..... H01L 39/00; H01L 39/025; H01L 39/045; H01L 39/223; H01L 39/2493; H01L 27/00; G02F 2/00; G11C 11/44; G11C 15/00; G11C 19/32; H01B 12/00; H01P 7/00; H01P 11/00; H03F 19/00; H03K 17/92; H03K 3/38
(Continued)

(56) References Cited

U.S. PATENT DOCUMENTS

| | | | |
|---|---|---|---|
| 4,437,227 A | 3/1984 | Flannery et al. | |
| 5,635,730 A * | 6/1997 | Sakakibara | ......... H01L 39/2461 257/34 |

(Continued)

OTHER PUBLICATIONS

Co-pending U.S. Appl. No. 12/783,116, filed May 19, 2010.

*Primary Examiner* — Mary Wilczewski
*Assistant Examiner* — Tsz Chiu
(74) *Attorney, Agent, or Firm* — Tarolli, Sundheim, Covell & Tummino LLP

(57) ABSTRACT

A Josephson junction (JJ) quantum bit (qubits) arranged on a substrate is provided. In one embodiment, each qubit comprises a dielectric layer, a superconductor base layer portion underlying the dielectric layer and a first dielectric diffused region adjacent a dielectric layer/superconductor base layer portion junction. The qubit further comprise a superconductor mesa layer portion overlying the dielectric layer and having a second dielectric diffused region adjacent a dielectric layer/superconductor mesa layer portion junction, the first and second dielectric diffused regions mitigating further diffusion from other semiconductor processes on the plurality of qubits.

15 Claims, 6 Drawing Sheets

(58) Field of Classification Search
USPC .......................................................... 257/31
See application file for complete search history.

(56) References Cited

U.S. PATENT DOCUMENTS

| | | | | |
|---|---|---|---|---|
| 6,154,109 | A * | 11/2000 | Gold | ........................ H01F 36/00 335/216 |
| 8,735,326 | B2 | 5/2014 | Folk et al. | |
| 2003/0107033 | A1 * | 6/2003 | Tzalenchuk | ............ B82Y 10/00 257/31 |
| 2003/0207765 | A1 * | 11/2003 | Bower | ................. H01L 39/2487 505/100 |
| 2004/0165454 | A1 * | 8/2004 | Amin | ..................... B82Y 10/00 365/200 |
| 2005/0224784 | A1 * | 10/2005 | Amin | .................... G06N 99/002 257/14 |
| 2011/0089405 | A1 * | 4/2011 | Ladizinsky et al. | ............. 257/31 |

* cited by examiner

QUANTUM BITS AND METHODS OF FORMING THE SAME

RELATED APPLICATIONS

The present divisional application claims priority from U.S. patent application ser. No. 13/294,473, filed Nov. 11,2011, the entirety of which is incorporated herein by reference.

TECHNICAL FIELD

The present invention relates generally to superconductors, and more particularly to quantum bits and a method of forming the same.

BACKGROUND

Efforts on fabrication of quantum bits (qubits) have mostly been confined to university or government research labs, with little published on the mass production of qubit circuits. Therefore, many of the methods used to fabricate qubits in these laboratories utilize processes or equipment incapable of rapid, consistent fabrication. For example, most qubit fabrication methods utilize electron beam lithography (EBL). EBL is great for fabricating small feature sizes, but is usually very slow, taking several hours to write a wafer. The tradeoff then becomes using small samples with acceptable production time, or large samples with long production times. Some literature reports on rapid fabrication of superconducting phase qubits, but typically small samples are used that don't exploit the relative economies of scale that make volume semiconductor fabrication so attractive. Small samples can be utilized with quick turn-around time, but in the end many samples need to be fabricated. Therefore, the entire process flow needs to be repeated increasing the likelihood of errors at any step in the process flow.

Superconducting qubits based on Josephson junctions are one of the leading technologies proposed for quantum computing and cryptography applications that are expected to provide significant enhancements to national security applications where communication signal integrity or computing power are needed. However, presently these devices remain laboratory curiosities due to the difficulty in achieving reproducible results. Furthermore, the need for low temperature processing currently presents one of the more significant barriers to mass producing JJ superconducting qubits. The current thoughts are that low temperatures are required due to the delicate nature of the metal-oxide-metal JJs and that high temperature excursions diffuse the thin oxide that forms the tunnel junction, or induce a chemical reaction, thereby affecting both the junction energy barrier height and width. Therefore, to be able to reliably manufacture superconducting qubits and control diffusion caused by high temperatures would provide a revolutionary step towards making the ideas of quantum cryptography and computing a reality.

SUMMARY

In one aspect of the invention, a method is provided of forming Josephson junction (JJ) quantum bits (qubits). The method comprises forming a JJ trilayer on a substrate. The JJ trilayer is comprised of a dielectric layer sandwiched between a bottom superconductor material layer and a top superconductor material layer. The method further comprises performing a thermal hardening process on the JJ trilayer to control diffusion of the dielectric layer into the bottom superconductor material layer and the top superconductor material layer, and etching openings in the JJ trilayer to form one or more JJ qubits.

In yet another aspect of the invention, a method is provided of forming JJ qubits. The method comprises depositing a first superconductor material layer over a substrate, forming a dielectric layer over the first superconductor material layer, and depositing a second superconductor material layer over the dielectric layer. The first superconductor material layer, the dielectric layer and the second superconductor material layer form a JJ trilayer. The method further comprises annealing the JJ trilayer in an inert environment at a temperature between about 150° C. to about 400° C. for a time period between about 15 minute to about 120 minutes to control diffusion of the dielectric layer into the first superconductor material layer and the second superconductor material layer, and etching openings in the JJ trilayer to form one or more JJ qubits.

In yet a further aspect of the invention, a plurality of JJ qubits are arranged on a substrate. Each of the plurality of qubits comprise a dielectric layer, a superconductor base layer portion underlying the dielectric layer and having a first dielectric diffused region adjacent a dielectric layer/superconductor base layer portion junction and a superconductor mesa layer portion overlying the dielectric layer and having a second dielectric diffused region adjacent a dielectric layer/superconductor mesa layer portion junction. The first and second dielectric diffused regions mitigate further diffusion caused by other semiconductor processes on each of the plurality of JJ qubits.

DETAILED DESCRIPTION

The present invention is directed to employing a thermal hardening process of Josephson junction Phase Quantum Bits (JJ qubits) after formation of the JJ qubits or after formation of a JJ trilayer that is employed to form the JJ qubits. The thermal hardening process mitigates junction travel or diffusion caused from subsequent processing. The thermal hardening process allows the JJ qubits to be processed in the common temperature range (e.g., ≥300° C.) of standard silicon (Si), such that no further, special low temperature processing is required. The disclosed invention, therefore, reduces cycle time and production cost, and increases yield and uniformity by enabling the use of more effective processing methods and produces more reliable qubits.

In an aspect of the invention, a protective barrier layer protects a superconductor material layer from a photoresist developer during the formation of an etch mask to etch superconductor patterns in the superconductor material layer. In one aspect of the invention, the protective barrier layer is formed of an organic spin-on material that can be cured at temperatures at or above 150° C. (e.g., 180° C.). In an aspect of the invention, the superconductor material layer is aluminum and the photoresist developer contains sodium hydroxide (NaOH) that can cause etching of the aluminum (Al). In yet a further aspect of the invention, the organic spin-on material is an organic anti-reflective coating. In yet another aspect of the invention, the protective barrier layer is a photosensitive material and is cured by employing a photocuring process (e.g., exposure to ultraviolet light (UV)).

Figure 1:
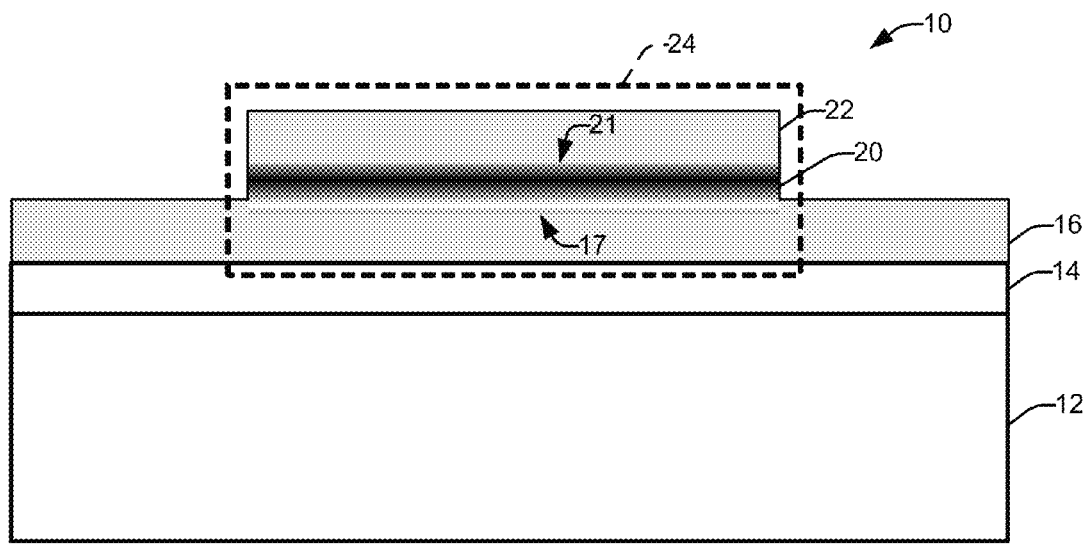
FIG. 1 illustrates a schematic cross-sectional view of a Josephson junction (JJ) phase quantum bit (qubit) assembly in accordance with an aspect of the present invention.

FIG. 1 illustrates a cross-sectional view of a Josephson junction (JJ) phase quantum bit (qubit) assembly 10 in accordance with an aspect of the present invention. The JJ phase qubit assembly 10 comprises a JJ qubit 24 residing over an insulator layer 14 that resides over a substrate 12. The JJ qubit 24 is formed of a dielectric layer 20 sandwiched between a superconductor base layer portion 16 and a superconductor mesa layer portion 22 aligned with one another. The substrate 12 can be formed of silicon or another substrate material and the insulator layer 14 can be formed of an oxide or other insulator material. Alternatively, the substrate 12 can be formed of an insulating substrate, such that the insulating layer 14 can be omitted during fabrication of the JJ phase qubit assembly 10. Formation of the JJ phase qubit assembly 10 requires a series of precise metal and metal-and-insulator etch steps guided by lithography to pattern the comprising films into the requisite device structures.

The present invention utilizes a thermal anneal process in the JJ qubit assembly fabrication process that results in a controlled diffusion of the dielectric layer 20 into both the superconductor base layer portion 16 and the superconductor mesa layer portion 22. This results in the formation of a first dielectric diffused region 17 in the superconductor base layer portion 16 adjacent a dielectric layer/superconductor base layer portion junction and a second diffused region 21 in the superconductor mesa layer portion 22 adjacent a dielectric layer/superconductor mesa layer portion junction. The thermal anneal process can be performed on the JJ qubit 24, or on a JJ trilayer employed to form the JJ qubit 24 prior to formation of the JJ qubit 24. The thermal anneal can be performed in an inert environment (e.g, in a nitrogen, argon, or helium environment, or in a vacuum) and exposing the JJ qubit 24 to a temperature of about 150° C. to about 400° C. (e.g., 300° C.) for about 15 minutes to about 120 minutes. This tunes or shifts the critical current density of the JJ 24 from a first critical current defined by the dimensions (e.g., thickness of the dielectric layer 20) of the JJ qubit 24 to a second critical current defined by the temperature anneal. The controlled diffusion allows for employment of standard silicon processing equipment and techniques in subsequent semiconductor processes since the controlled diffusion mitigates further deleterious affects that would produce uncontrolled diffusion and unknown changes to the critical current density.

Photolithography is repeated for each masking layer in the formation of the JJ phase qubit 24. Because the photoresist developers utilized in silicon processing can contain materials (e.g., sodium hydroxide (NaOH)) that etch superconductors (e.g., Al), a protective barrier layer can be formed over one or more of the superconductor material layers before deposition of photoresist. The protective barrier layer protects the one or more superconductor material layers from unintentional etching, but is cleared easily in a dry etch process prior to the superconductor material layer etch.

In an aspect of the present invention, the JJ qubit 24 comprises a double-mesa structure with a bottom layer of pure aluminum (Al) or an aluminum-copper alloy (Al—Cu). Overlying the bottom of aluminum or the aluminum-copper alloy layer is an ultrathin layer (10-20 angstroms, or 1-2 billionths of a meter) of aluminum oxide ($Al_2O_3$). The aluminum oxide layer can be formed, without exposure to ambient environments, by flowing pure oxygen in the presence of an aluminum layer. This aluminum oxide can either be formed by depositing aluminum, and then oxidizing the aluminum to form aluminum oxide, or by a deposition process such as atomic layer deposition (ALD) that directly forms aluminum oxide. Following the aluminum oxide formation, another layer of aluminum or the aluminum-copper alloy layer is deposited over the aluminum oxide layer.

Although the present example refers to aluminum-aluminum oxide qubits, one could apply the same methods to other metal-oxide systems. For example, the base and mesa (or top) metals can be comprised of niobium (Nb) with the thin tunnel oxide being a deposited dielectric other than aluminum oxide, such as hafnium oxide ($HfO_2$) or yttrium oxide ($Y_2O_3$).

As previously discussed, applying a thermal cycle during the formation of JJ qubits has been avoided due to the damage that the thermal cycling caused to the JJ qubit. However, recent experiments have shown that such heating produces a limited change in the critical junction current at room temperature, indicating minimal effect on the JJ qubit performance. The disclosed invention intentionally integrates a thermal anneal into the JJ qubit fabrication process that essentially hardens the superconductor-dielectric junction against junction travel or subsequent diffusion resulting from additional processing.

Figure 2:
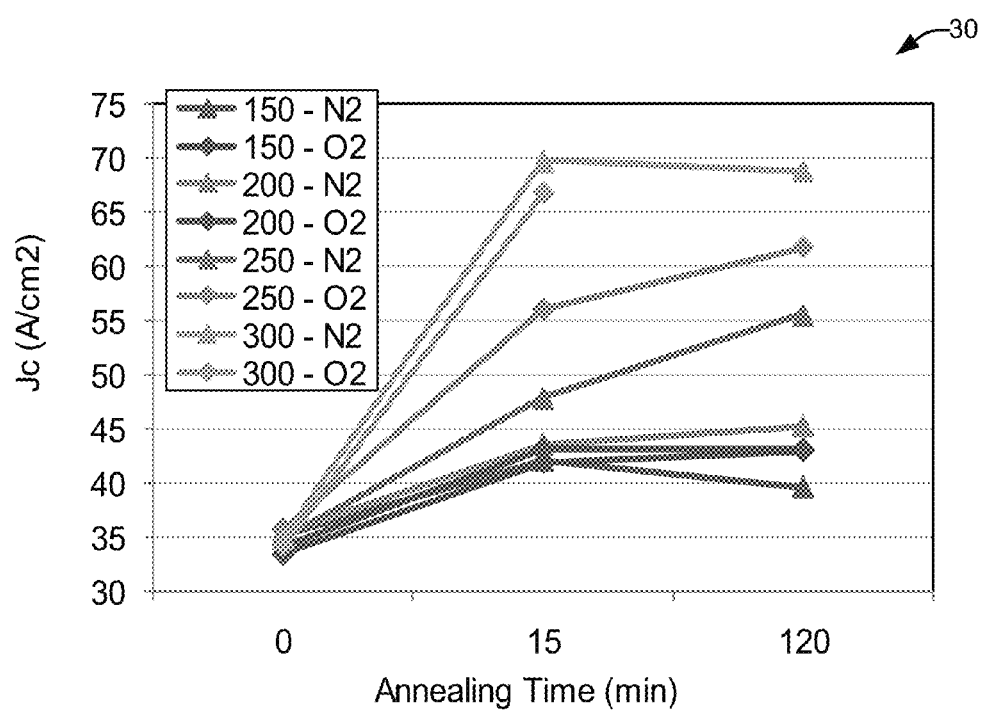
FIG. 2 illustrates a graph of critical current density of exemplary JJ qubits versus annealing time at different temperatures and environments.
Figure 3:
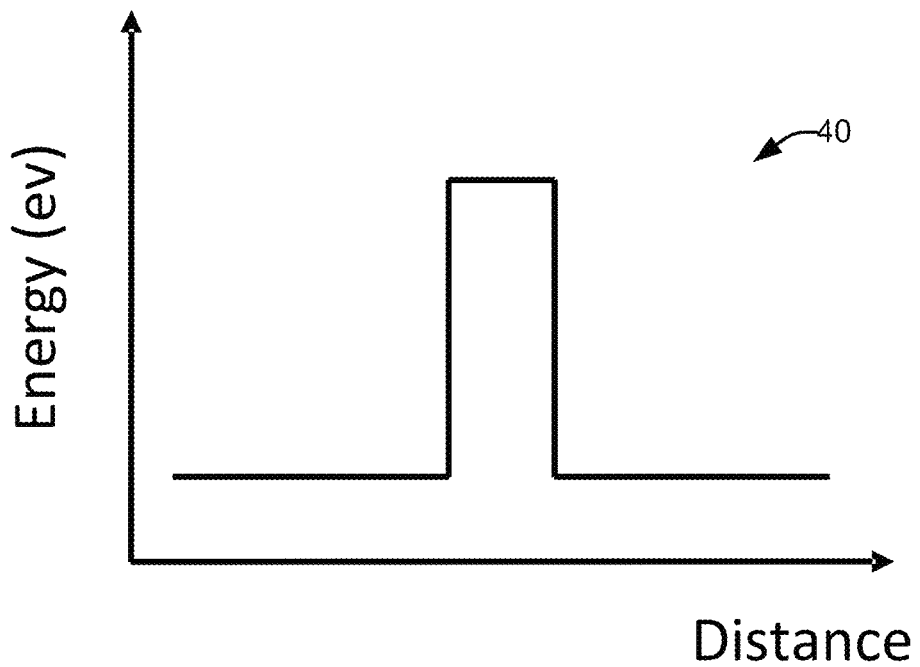
FIG. 3 illustrates a graph of distance versus energy barrier for a tunnel oxide of a JJ qubit that was not subjected to a thermal hardening process.
Figure 4:
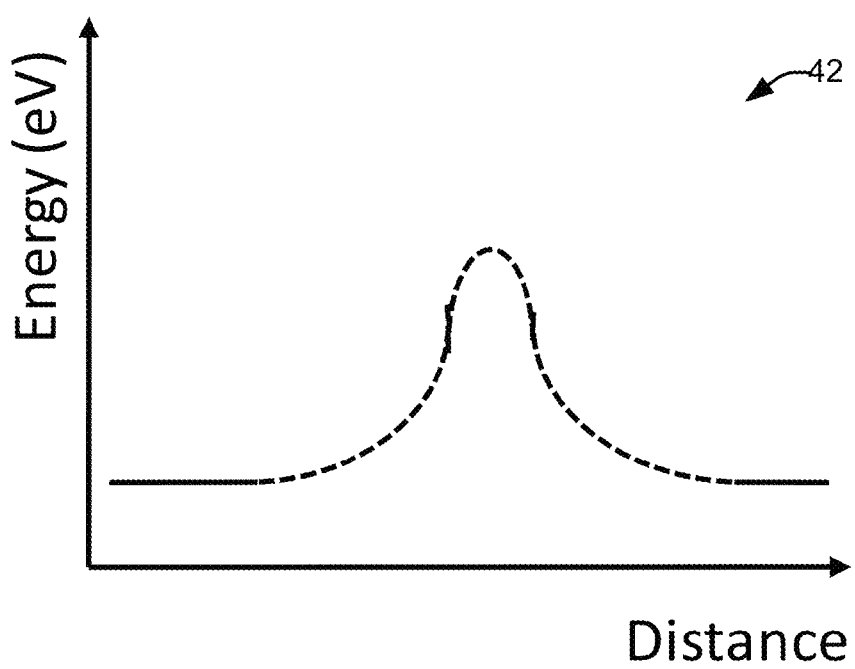
FIG. 4 illustrates a graph of distance versus energy barrier for a tunnel oxide of a JJ qubit that was subjected to a thermal hardening process.

FIG. 2 illustrates a graph 30 of critical current density of exemplary JJ qubits versus annealing time at different temperatures (e.g., 150° C. to 300° C.) and environments (e.g., $N_2$, $O_2$). As shown in FIG. 2, at a temperature of 300° C., heating beyond 15 minutes has a limited effect on the superconductor-dielectric junction behavior. Thus, applying a thermal cycle to the JJ junction immediately following its formation will harden the junction against other thermal cycles that might be introduced during the foundry process to produce the junctions. In its pristine, as-grown state, the tunnel oxide in the JJ forms an energy barrier with a discrete barrier height and thickness, as shown a graph 40 of distance versus energy in FIG. 3. As illustrated in a graph 42 of distance versus energy in FIG. 4, the thermal processing induces diffusion of the oxide, smearing the junction, thereby lowering the energy barrier height and increasing its width.

It is to be appreciated that there are several benefits to this thermal hardening process. For example, to harden a photoresist against being etched unintentionally, one typically hardens it by heating it to >180° C. and exposing it to UV light. Furthermore, the most effective way to strip a hardened photoresist is to heat it to >215° C. and expose it to ozone. These steps were unavailable to qubit fabrication prior to adding the junction thermal hardening process. Fabrication of the junctions can suffer without this process because one must account for the photoresist getting etched unintentionally, or stripped incompletely. Another example is metal etching. A metal etch is a process driven by chemical reaction, meaning that a higher temperature can make it more efficient. With low temperature etches, etch by-products have been found to have a deleterious effect on narrow metal lines, meaning that additional, expensive processing steps have to be added to protect the metal.

Figure 5:
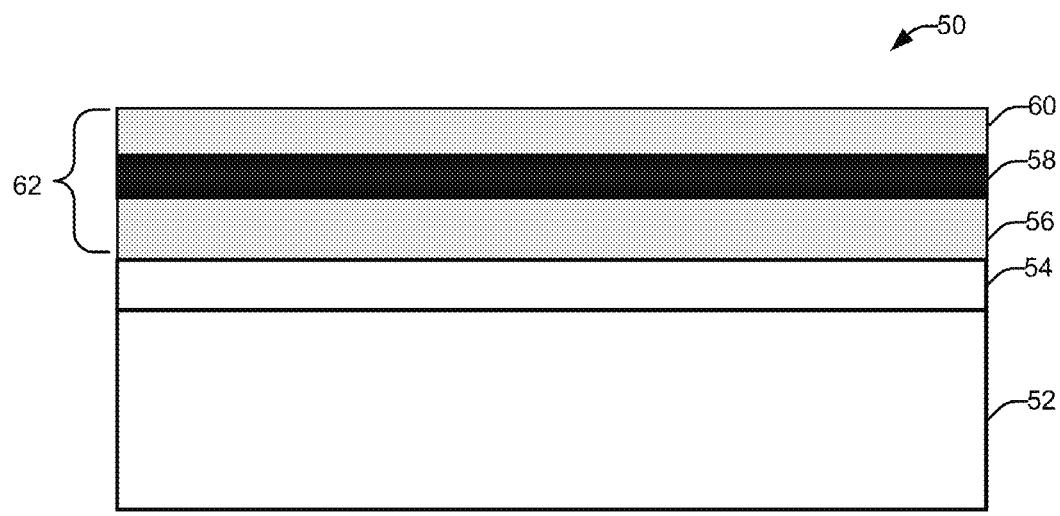
FIG. 5 illustrates a schematic cross-sectional view of a superconductor structure in its early stages of fabrication in accordance with an aspect of the present invention.

Turning now to FIGS. 5-12, fabrication is discussed in connection with formation of openings in the superconductor layers to form superconductor raised portions that can provide a plurality of JJ phase qubits similar to the JJ phase qubit illustrated in FIG. 1. FIG. 5 illustrates a superconductor structure 50 in its early stages of fabrication. The superconductor structure 50 includes a JJ trilayer 62 residing over an insulator layer 54 that resides over a substrate 52. The JJ trilayer 62 is formed of a dielectric layer 58 sandwiched between a first superconductor layer 56 and a second superconductor layer 60. The substrate 52 can be formed of silicon or another substrate material and the insulator layer 54 can be formed of an oxide or other insulator material. Alternatively, the substrate 52 can be formed of an insulating substrate (e.g., sapphire), such that the insulating layer 54 can be omitted during fabrication of the JJ phase qubit 50. The JJ trilayer 62 can be formed from deposition of the first superconductor material layer 56, such as Al, Al—Cu, Nb or some other superconductor material layer over the insulator layer 56 and forming the dielectric layer 58, such as aluminum oxide, hafnium oxide or yttrium oxide, over the first superconductor material layer 56. The aluminum oxide can be formed, for example, by depositing aluminum, and then oxidizing the aluminum to form aluminum oxide, or by a deposition process such as atomic layer deposition (ALD) that directly forms aluminum oxide. The second superconductor material layer 60 is then deposited on top of the dielectric layer 58.

Figure 6:
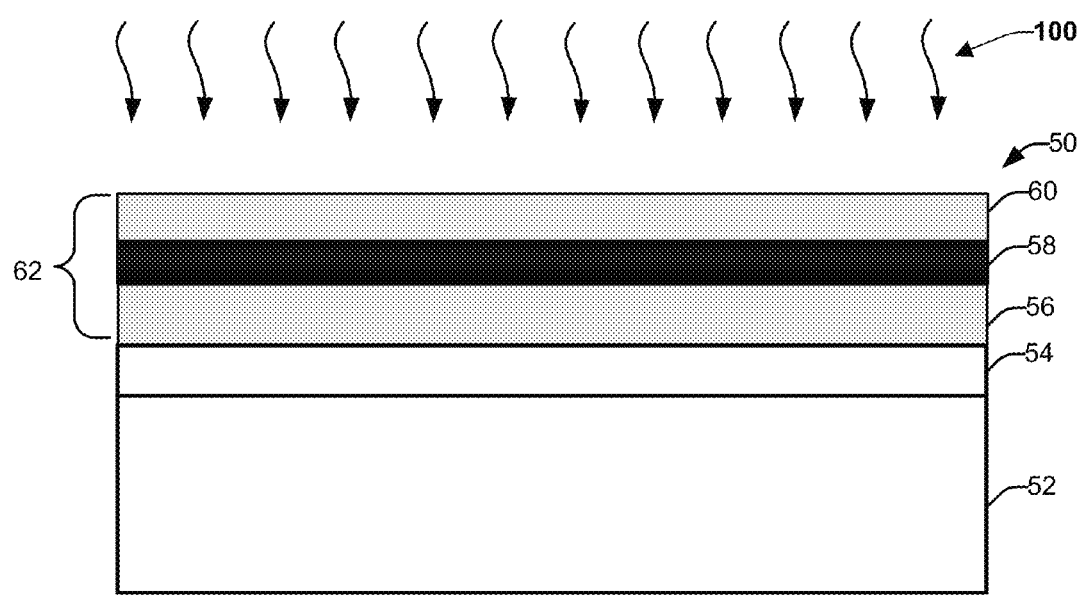
FIG. 6 illustrates a schematic cross-sectional view of the structure of FIG. 5 undergoing a temperature annealing process in accordance with an aspect of the present invention.
Figure 7:
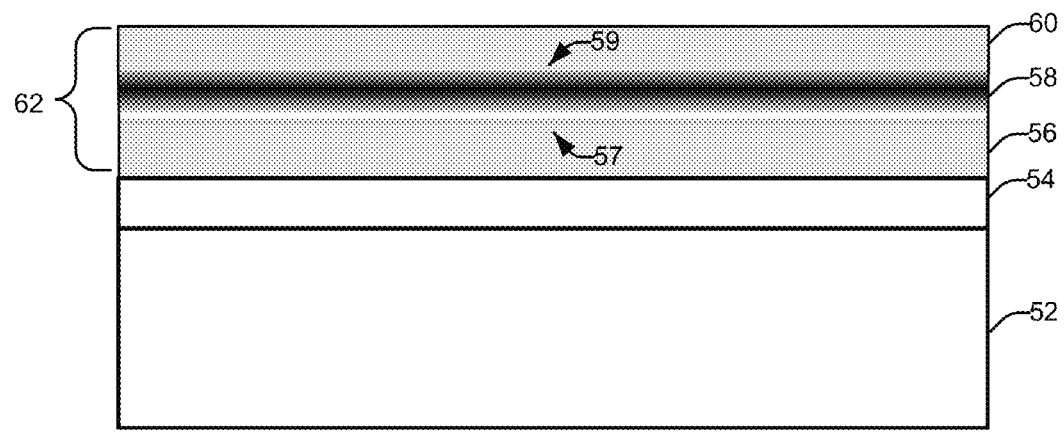
FIG. 7 illustrates a schematic cross-sectional view of the structure of FIG. 6 after the temperature annealing process in accordance with an aspect of the present invention.

As illustrated in FIG. 6, a thermal anneal process 100 is performed on the structure 50 of FIG. 5 that results in a controlled diffusion of the dielectric layer 58 into both the first superconductor material layer 56 and the second superconductor material layer 60 forming a first dielectric diffused region 57 in the first superconductor material layer 56 and a second dielectric diffused region 59 in the second superconductor material layer 60, as shown in the resultant structure illustrated in FIG. 7. The thermal anneal can be performed in an inert environment (e.g, in a nitrogen, argon, or helium environment, or in a vacuum) and exposing the JJ trilayer 62 to a temperature of about 150° C. to about 400° C. (e.g., 300° C.) for about 15 minutes to about 120 minutes. As previously stated, this tunes or shifts the critical current density of the subsequent JJ to be formed from a first critical current defined by the dimension of the qubit (e.g., the dielectric layer) to a second critical current defined by the temperature anneal. The controlled diffusion allows for employment of standard silicon processing equipment and techniques sinces the controlled diffusion mitigates further deleterious effects of further processing that would produce uncontrolled diffusion and unknown changes to the critical current density.

Figure 8:
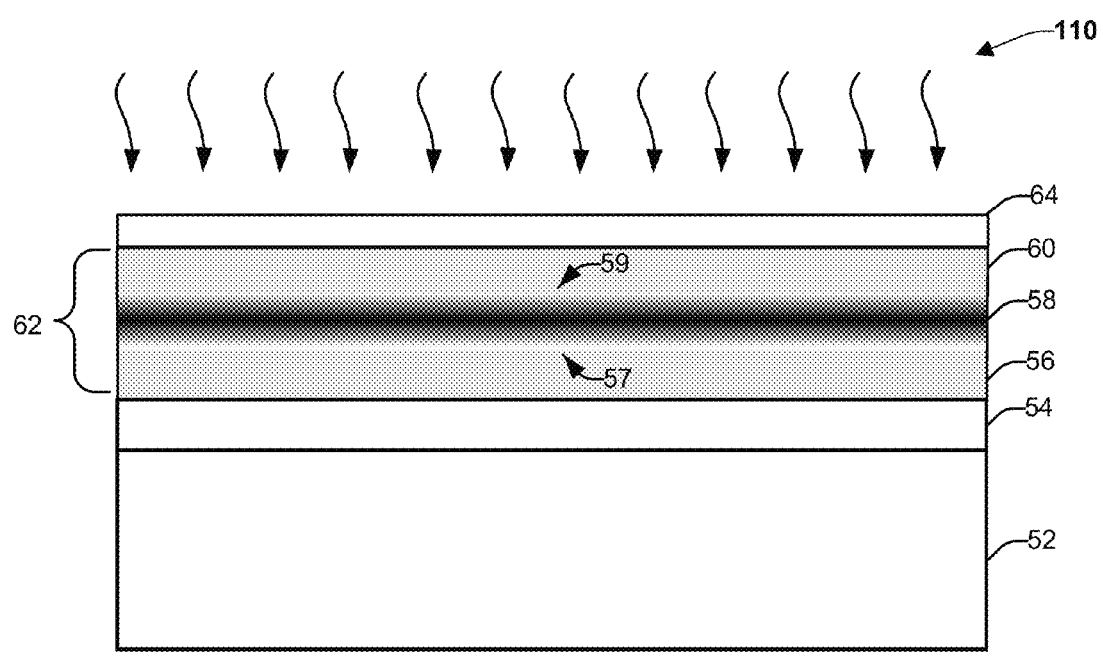
FIG. 8 illustrates a schematic cross-sectional view of the structure of FIG. 7 after a protective barrier layer has been deposited and is undergoing a curing process in accordance with an aspect of the present invention.

As illustrated in FIG. 8, a protective barrier layer 64 is formed over the second superconductor material layer 60 and protects the second superconductor material layer 60 from a photoresist developer utilized during the formation of an etch mask to etch openings to form patterns in the JJ trilayer 62. Any suitable technique for forming the protective barrier layer 62 may be employed such as Low Pressure Chemical Vapor Deposition (LPCVD), Plasma Enhanced Chemical Vapor Deposition (PECVD), Atomic Layer Deposition (ALD), sputtering or spin on techniques to a thickness suitable for providing protection of the underlying superconductor material layer 60 and/or 56. The protective barrier layer 64 can have a thickness, for example, of about 600 Å to about 800 Å (e.g., 700 Å).

In one aspect of the invention, the protective barrier layer 64 can be formed of an organic spin-on material (e.g., an organic anti-reflective coating (ARC)) that can be cured at temperatures at or above 150° C. In an aspect of the invention, the organic spin-on material is a dry-etchable ARC material that includes a recommendation to cure the dry-etchable ARC material at a temperature of 180° C. for 60 seconds. Prior to the disclosed invention, temperatures above 150° C. would alter the critical current of the subsequently formed JJ qubit. However, it has been determined that due to the hardening process, the material can be cured at its recommended temperature and time without further affecting the critical current density of the JJ qubit. Alternatively, the protective barrier layer 64 is a photosensitive material and is cured by employing a photocuring process (e.g., exposure to ultraviolet light (UV)). As illustrated in FIG. 8, a curing process 110 is performed on the protective barrier layer at a temperature of 180° C. for 60 seconds.

Figure 9:
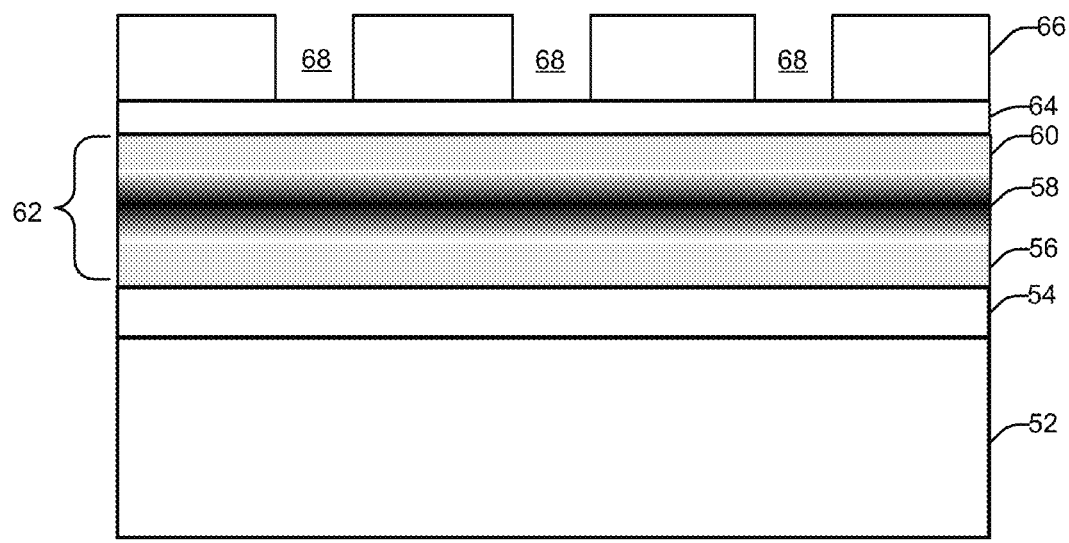
FIG. 9 illustrates a schematic cross-sectional view of the structure of FIG. 8 after a photoresist material layer has been deposited and patterned in accordance with an aspect of the present invention.

Next, as represented in FIG. 9, a photoresist material layer 66 is applied to cover the structure and is then patterned and developed to expose open regions 68 in the photoresist material layer 66 in accordance with an opening pattern. The photoresist material layer 66 can have a thickness that varies in correspondence with the wavelength of radiation used to pattern the photoresist material layer 66. The photoresist material layer 66 may be formed over the protective barrier layer 64 via spin-coating or spin casting deposition techniques, selectively irradiated and developed to form the openings 68. The developer utilized in the developing of the photoresist has no effect on the protective barrier layer 64.

Figure 10:
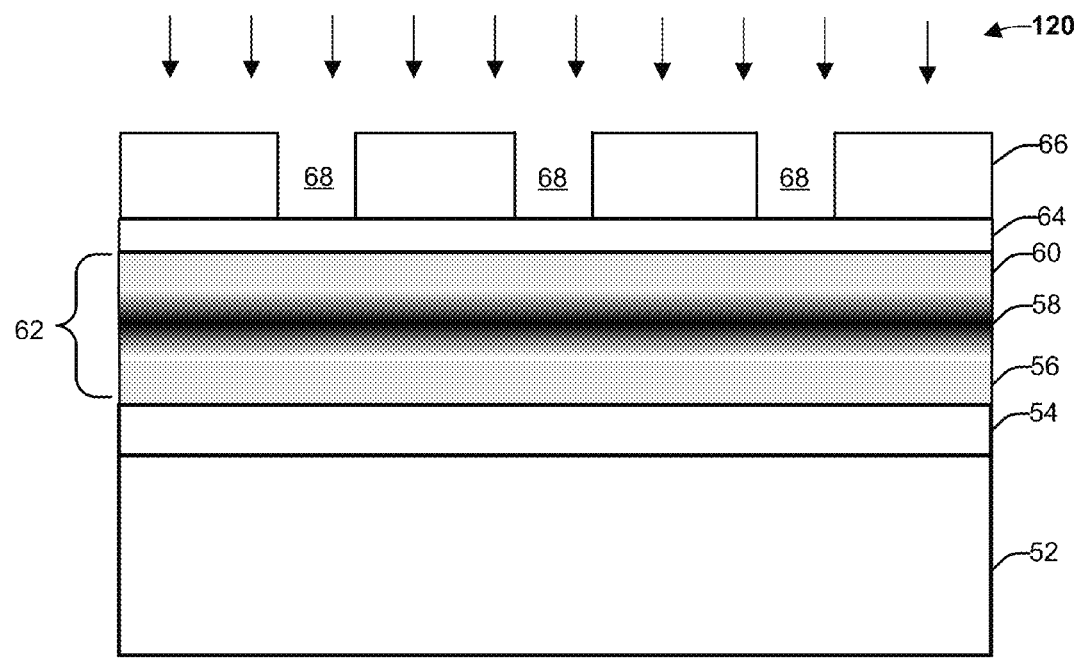
FIG. 10 illustrates a schematic cross-sectional view of the structure of FIG. 9 undergoing an etch step to extend openings in the protective barrier layer in accordance with an aspect of the present invention.

FIG. 10 illustrates performing of an etch 120 (e.g., anisotropic reactive ion etching (RIE)) on the protective barrier layer 68 to form extended openings 70 (FIG. 11) in the protective barrier layer 66 based on the opening pattern in the photoresist material layer 68. The etch step 120 can be a dry etch or wet etch that employs an etchant which selectively etches the protective barrier layer 64 at a faster rate than the underlying superconductor material layer 60 and the overlying photoresist material layer 66. For example, the protective barrier layer 64 may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the patterned of the photoresist material layer 66 to thereby create the extended openings 70 (FIG. 11).

Figure 11:
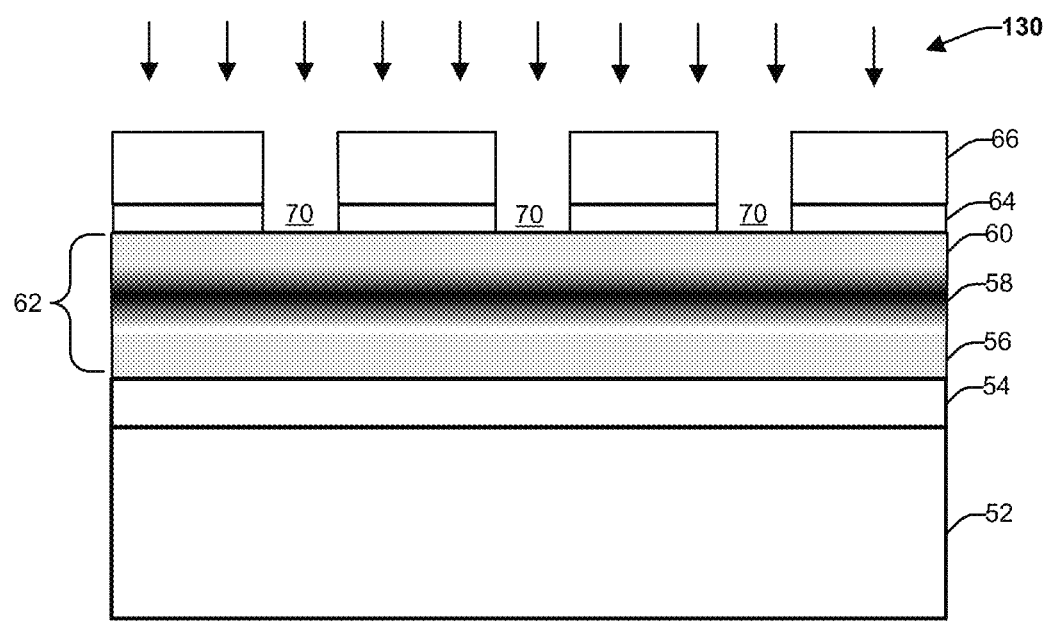
FIG. 11 illustrates a schematic cross-sectional view of the structure of FIG. 10 undergoing an etch step to extend openings in a JJ trilayer in accordance with an aspect of the present invention.
Figure 12:
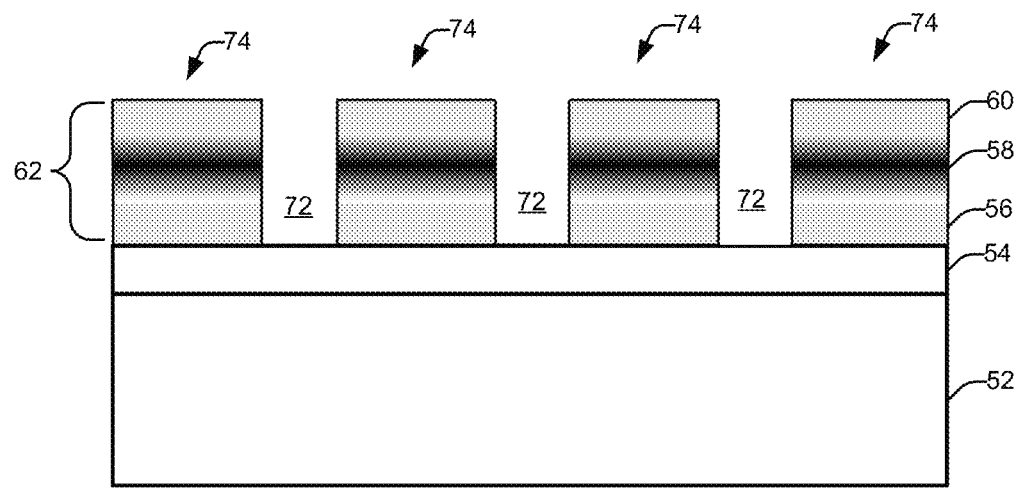
FIG. 12 illustrates a schematic cross-sectional view of the structure of FIG. 11 after the etch step to extend openings in the JJ trilayer and after undergoing a strip of the photoresist material layer and the protective barrier layer in accordance with an aspect of the present invention.

FIG. 11 illustrates performing of an etch step 130 on the JJ trilayer 62 to form extended openings 72 (FIG. 12) in the JJ trilayer layer 62. It is to be appreciated that separate etch steps can be performed on the second superconductor material layer 60, the dielectric layer 58 and the first superconductor material layer 56. A second barrier layer as described above could be employed to protect the first superconducting layer 56 from the photoresist developer. The etch 130 can be, for example, a dry chlorine based plasma etch. For example, the JJ trilayer 62 can be anisotropically etched with a plasma gas(es) containing chlorine ions, in a commercially available etcher, such as a parallel plate Reactive Ion Etch (RIE) apparatus, Inductively Coupled Plasma (ICP) reactor or, alternatively, an electron cyclotron resonance (ECR) plasma reactor to replicate the mask pattern of the patterned photoresist material layer 66 to thereby create the opening pattern in the JJ trilayer 62. Alternatively, the etch 130 may be a wet etch. The photoresist material layer 66 and the protective barrier layer 64 are thereafter stripped (e.g., ashing in an $O_2$ plasma) so as to result in the structure shown in FIG. 12, which illustrates a set of superconductor material raised portions 74 that can be employed as a plurality of JJ qubits. It is to be appreciated that subsequent additional processing steps can be employed to form conductive lines and contacts to the set of superconductor material raised portions 74.

What has been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A plurality of Josephson junction (JJ) quantum bit (qubits) arranged on a substrate, each of the plurality of qubits comprising:
    a dielectric layer;
    a superconductor base layer portion underlying the dielectric layer and having a first dielectric diffused region in the superconductor base layer portion adjacent a dielectric layer/ superconductor base layer portion junction; and
    a superconductor mesa layer portion overlying the dielectric layer and having a second dielectric diffused region in the superconductor mesa layer portion adjacent a dielectric layer/ superconductor mesa layer portion junction, the first and second dielectric diffused regions mitigating further diffusion from other semiconductor processes on the plurality of qubits;
    wherein the first and second dielectric diffused regions of a given JJ qubit define a critical current density of the given JJ qubit as a second critical current density that is greater than a first critical current density of the given JJ qubit implemented without the first and second diffused regions.

2. The plurality of qubits of claim 1, wherein the dielectric layer of each qubit is aluminum oxide ($Al_2O_3$), and each of the superconductor base layer portion and superconductor mesa layer portion are either one of aluminum (Al) and aluminum-copper (Al-Cu).

3. The plurality of qubits of claim 1, wherein the dielectric layer of each qubit is formed of a dielectric material that provides for hardening the superconductor-dielectric junction against junction travel and/or subsequent diffusion resulting from additional processing and each of the superconductor base layer portion and superconductor mesa layer portion are niobium (Nb).

4. The plurality of qubits of claim 1, wherein a pattern of extended openings separate each of the plurality of qubits from an adjacent qubit.

5. The plurality of qubits of claim 1, wherein the plurality of qubits are formed on an insulting layer that resides between the plurality of qubits and the substrate.

6. The plurality of qubits of claim 1, wherein the superconductor base layer portion and superconductor mesa layer portion are aligned with one another.

7. The plurality of qubits of claim 1, wherein the dielectric layer is one of HfO2 and Y2O3.

8. The plurality of qubits of claim 1, further comprising one or more conductive lines and contacts connecting to the plurality of qubits.

9. The plurality of qubits of claim 1, wherein the second critical current density is selected based on an annealing temperature employed to form the first and second dielectric regions.

10. A plurality of Josephson junction (JJ) quantum bit (qubits) separated by a pattern of extended openings and arranged on an insulting layer that resides between the plurality of qubits and a substrate, each of the plurality of qubits comprising:
    a superconductor base layer portion underlying a dielectric layer and having a first dielectric diffused region in the superconductor base layer portion adjacent a dielectric layer/ superconductor base layer portion junction; and
    a superconductor mesa layer portion overlying the dielectric layer and having a second dielectric diffused region in the superconductor mesa layer portion adjacent a dielectric layer/ superconductor mesa layer portion junction, the first and second dielectric diffused regions mitigating further diffusion from other semiconductor processes on the plurality of qubits, the superconductor base layer portion and superconductor mesa layer portion being aligned with one another,
    wherein the first and second dielectric diffused regions of each respective JJ qubit of the plurality of JJ qubits define a critical current density of each respective JJ qubit of the plurality of JJ qubits as a second critical current density that is greater than a first critical current density of each respective JJ qubit of the plurality of implemented without the first and second dielectric diffused regions.

11. The plurality of qubits of claim 1, wherein the critical current density of the given JJ qubit is at least 40 amperes per square centimeter ($A/cm^2$).

12. The plurality of qubits of claim 1, wherein the critical current density of the given JJ qubit is at least 50 amperes per square centimeter ($A/cm^2$).

13. The plurality of qubits of claim 1, wherein the critical current density of the given JJ qubit is at least 65 amperes per square centimeter ($A/cm^2$).

14. The plurality of qubits of claim 1, wherein the first critical current density of the given JJ qubit is defined by a thickness of the dielectric layer of the given JJ qubit.

15. A Josephson junction (JJ) quantum bit (qubit) comprising:
   a dielectric layer;
   a superconductor base layer portion underlying the dielectric layer and having a given dielectric diffused region in the superconductor base layer portion adjacent a dielectric layer/ superconductor base layer portion junction; and
   a superconductor mesa layer portion overlying the dielectric layer and having another dielectric diffused region in the superconductor mesa layer portion adjacent a dielectric layer/ superconductor mesa layer portion junction, the given and the another dielectric diffused regions mitigate further diffusion from other semiconductor processes on the plurality of qubits and a critical current density of the JJ qubit is at least 40 amperes per square centimeter ($A/cm^2$).

* * * * *